United States Patent
Sundgren et al.

(10) Patent No.: US 9,853,188 B2
(45) Date of Patent: Dec. 26, 2017

(54) LIGHT-EMITTING DIODE CHIP WITH CURRENT SPREADING LAYER

(71) Applicant: OSRAM Opto Semiconductors GmbH, Regensburg (DE)

(72) Inventors: Petrus Sundgren, Regensburg (DE); Elmar Baur, Regensburg (DE); Martin Hohenadler, Regensburg (DE); Clemens Hofmann, Neutraubling (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/830,616

(22) Filed: Aug. 19, 2015

(65) Prior Publication Data

US 2015/0357516 A1  Dec. 10, 2015

Related U.S. Application Data

(62) Division of application No. 13/640,037, filed as application No. PCT/EP2011/055566 on Apr. 8, 2011, now abandoned.

(30) Foreign Application Priority Data

Apr. 12, 2010  (DE) ........................ 10 2010 014 667

(51) Int. Cl.
  H01L 33/02 (2010.01)
  H01L 33/14 (2010.01)
  (Continued)

(52) U.S. Cl.
  CPC ............ H01L 33/14 (2013.01); H01L 31/112 (2013.01); H01L 33/02 (2013.01); H01L 33/30 (2013.01);
  (Continued)

(58) Field of Classification Search
  CPC ............. H01L 31/1124; H01L 31/1126; H01L 31/1127; H01L 31/1129
  (Continued)

(56) References Cited

U.S. PATENT DOCUMENTS 4,080,245 A   3/1978  Yamanaka et al.
4,901,330 A * 2/1990  Wolfram ............. H01S 3/09415
                                               372/46.01
(Continued)

FOREIGN PATENT DOCUMENTS

CN   101681958 A   3/2010
CN   102834937 B   8/2015
(Continued)

*Primary Examiner* — Cheung Lee
(74) *Attorney, Agent, or Firm* — Slater Matsil, LLP (57) ABSTRACT

A light-emitting diode chip includes a semiconductor layer sequence having a phosphide compound semiconductor material. The semiconductor layer sequence contains a p-type semiconductor region, an n-type semiconductor region, and an active layer arranged between the p-type semiconductor region and the n-type semiconductor region. The active region serves to emit electromagnetic radiation. The n-type semiconductor region faces a radiation exit area of the light-emitting diode chip, and the p-type semiconductor region faces a carrier of the light-emitting diode chip. A current spreading layer having a thickness of less than 500 nm is arranged between the carrier and the p-type semiconductor region. The current spreading layer has one or a plurality of p-doped $Al_xGa_{1-x}As$ layers with $0.5 < x \leq 1$.

20 Claims, 3 Drawing Sheets

(51) Int. Cl.
*H01L 33/60* (2010.01)
*H01L 33/48* (2010.01)
*H01L 33/30* (2010.01)
*H01L 31/112* (2006.01)
*H01L 33/38* (2010.01)
*H01L 33/40* (2010.01)

(52) U.S. Cl.
CPC .......... *H01L 33/305* (2013.01); *H01L 33/382* (2013.01); *H01L 33/40* (2013.01); *H01L 33/486* (2013.01); *H01L 33/60* (2013.01); *H01L 2924/0002* (2013.01)

(58) Field of Classification Search
USPC .......................................................... 257/94
See application file for complete search history.

(56) References Cited

U.S. PATENT DOCUMENTS

| | | | |
|---|---|---|---|
| 6,191,438 | B1 | 2/2001 | Ikehara et al. |
| 6,339,607 | B1* | 1/2002 | Jiang ................ H01S 5/026 372/50.1 |
| 6,426,518 | B1 | 7/2002 | Shakuda et al. |
| 8,093,579 | B2 | 1/2012 | Mayer et al. |
| 8,653,540 | B2 | 2/2014 | Engl et al. |
| 2002/0017652 | A1 | 2/2002 | Illek et al. |
| 2002/0137244 | A1* | 9/2002 | Chen ................ H01L 21/6835 438/22 |
| 2003/0091085 | A1 | 5/2003 | Northrup et al. |
| 2004/0021142 | A1 | 2/2004 | Kuo |
| 2004/0061101 | A1 | 4/2004 | Noto et al. |
| 2004/0135166 | A1 | 7/2004 | Yamada et al. |
| 2004/0227142 | A1 | 11/2004 | Izumiya |
| 2006/0078020 | A1 | 4/2006 | Izu et al. |
| 2007/0075327 | A1 | 4/2007 | Arai et al. |
| 2007/0114550 | A1 | 5/2007 | Kato et al. |
| 2008/0237622 | A1 | 10/2008 | Choi et al. |
| 2009/0101923 | A1* | 4/2009 | Choi ................ H01L 33/20 257/89 |
| 2010/0171135 | A1* | 7/2010 | Engl ................ H01L 33/382 257/98 |
| 2013/0221392 | A1 | 8/2013 | Engl et al. |

FOREIGN PATENT DOCUMENTS

| | | |
|---|---|---|
| DE | 102005029272 A1 | 10/2006 |
| DE | 102007022947 A1 | 10/2008 |
| DE | 102007023878 A1 | 11/2008 |
| DE | 102008010296 A1 | 6/2009 |
| EP | 2149159 A1 | 2/2010 |
| JP | S51149784 A | 12/1976 |
| JP | S52124885 A | 10/1977 |
| JP | S5892751 | 6/1983 |
| JP | H04212479 A | 8/1992 |
| JP | H07307489 A | 11/1995 |
| JP | H10335696 A | 12/1998 |
| JP | 2000101133 A | 4/2000 |
| JP | 2000200925 A | 7/2000 |
| JP | 2000307185 A | 11/2000 |
| JP | 2001077411 A | 3/2001 |
| JP | 2001185755 A | 7/2001 |
| JP | 2002190619 A | 7/2002 |
| JP | 2004506331 A | 2/2004 |
| JP | 2004281559 A | 10/2004 |
| JP | 2004356601 A | 12/2004 |
| JP | 2005183930 A | 7/2005 |
| JP | 2005276899 A | 10/2005 |
| JP | 2006287223 A | 10/2006 |
| JP | 2006344710 A | 12/2006 |
| JP | 2007096166 A | 4/2007 |
| JP | 2007103725 A | 4/2007 |
| JP | 2007189242 A | 7/2007 |
| JP | 2010525585 A | 7/2010 |
| WO | 2008131735 A1 | 11/2008 |

* cited by examiner

FIG 5

# LIGHT-EMITTING DIODE CHIP WITH CURRENT SPREADING LAYER

This application is a divisional of U.S. patent application Ser. No. 13/640,037, entitled "Light-Emitting Diode Chip with Current Spreading Layer," which was filed on Feb. 5, 2013 which is a national phase filing under section 371 of PCT/EP2011/055566, filed Apr. 8, 2011, which claims the priority of German patent application 10 2010 014 667.6, filed Apr. 12, 2010, each of which is incorporated herein by reference in its entirety.

TECHNICAL FIELD

The present invention relates generally to optical devices and, in particular embodiments, to a light-emitting diode chip with a current spreading layer.

BACKGROUND

In light-emitting diode chips, a comparatively thick current spreading layer composed of a semiconductor material having good electrical conductivity is generally arranged between the electrical contact and the light-emitting semiconductor layer sequence, in order to obtain as uniform a current flow as possible through the active layer.

By way of example, the document U.S. Pat. No. 6,426,518 B1 discloses a light-emitting diode chip wherein the light-emitting region is based on a phosphide compound semiconductor. A current spreading layer composed of p-AlGaAs is arranged between the electrical contact and the light-emitting region. The current spreading layer has a thickness of between 1 μm and 10 μm.

It has been found that with such comparatively thick current spreading layers composed of AlGaAs, a good current spreading layer can be obtained, but on the other hand a not inconsiderable proportion of the emitting radiation is also absorbed. The absorption by a thick current spreading layer is non-negligible in particular when the emitted radiation has a short wavelength and/or the proportion of aluminum in the current spreading layer is low. Furthermore, it has been found that an increase in the portion of aluminum in the current spreading layer increases the sensitivity of the light-emitting diode chip to moisture.

SUMMARY OF THE INVENTION

In one aspect, the invention specifies a light-emitting diode chip which comprises a current spreading layer having low optical absorption and at the same time low sensitivity to moisture.

In accordance with at least one embodiment, the light-emitting diode chip contains a semiconductor layer sequence comprising a phosphide compound semiconductor material. In particular, the semiconductor layer sequence comprises a plurality of layers composed of $In_xGa_yAl_{1-x-y}P$ with $0 \leq x \leq 1$, $0 \leq y \leq 1$ and $x+y \leq 1$.

The semiconductor layer sequence contains, in particular, a p-type phosphide compound semiconductor region, an n-type phosphide compound semiconductor region and an active layer arranged between the p-type phosphide compound semiconductor region and the n-type phosphide compound semiconductor region and serving for emitting electromagnetic radiation.

The active layer can be embodied e.g., as a pn junction, as a double heterostructure, as a multiple heterostructure, as a single quantum well structure or multiple quantum well structure. In this case, the designation quantum well structure encompasses any structure in which charge carriers experience a quantization of their energy states as a result of confinement. In particular, the designation quantum well structure does not include any indication about the dimensionality of the quantization. It therefore encompasses, inter alia, quantum wells, quantum wires or quantum dots and any combination of these structures.

In the case of the light-emitting diode chip, the n-type semiconductor region faces a radiation exit area of the light-emitting diode chip, and the p-type semiconductor region faces a carrier of the light-emitting diode chip. Preferably, the light-emitting diode chip is a so-called thin-film light-emitting diode chip, wherein a growth substrate used for the growth of the semiconductor layer sequence is detached from the light-emitting diode chip. The original growth substrate can be detached, in particular, from the n-type semiconductor region of the semiconductor layer sequence. At the side of the p-type semiconductor region opposite the original growth substrate, the light-emitting diode chip is preferably connected to the carrier, for example by means of a soldering connection. In this case, the carrier is different than a growth substrate of the semiconductor layers sequence and preferably comprises silicon, molybdenum or germanium. In contrast to conventional LEDs, wherein generally the n-type semiconductor region faces the substrate and the p-type semiconductor region faces the radiation exit area, in the case of the light-emitting diode chip the p-type semiconductor region faces the carrier and the n-type semiconductor region faces the radiation exit area.

A current spreading layer having a thickness of less than 500 nm is arranged between the carrier and the p-type semiconductor region, said current spreading layer consisting of one or a plurality of p-doped $Al_xGa_{1-x}As$ layer(s) with $0.5 < x \leq 1$.

By virtue of the fact that the current spreading layer is arranged between the carrier and the p-type semiconductor region, it is better protected against oxidation and/or the action of moisture than if it adjoined the ambient medium, in particular air, at the radiation exit side of the light-emitting diode chip.

It has furthermore been found that a current spreading layer having a thickness of less than 500 nm has lower sensitivity to oxidation and/or moisture than comparatively thick current spreading layers. This is possibly based on the fact that the volume of an AlGaAS layer increases if the layer partly oxidizes. In the case of the current spreading layer only having a thickness of less than 500 nm, this effect is less pronounced than in the case of a thicker layer.

Furthermore, the required growth time for the current spreading layer is advantageously reduced by virtue of the small thickness of the current spreading layer of less than 500 nm. Since the growth of the current spreading layer takes place at elevated temperatures, the reduction of the growth time also reduces the diffusion of impurities from the adjacent semiconductor layer sequence into the current spreading layer, for example the diffusion of dopants such as Mg and Zn from the p-type semiconductor region of the semiconductor layer sequence.

The small thickness of the current spreading layer of less than 500 nm furthermore advantageously reduces the optical absorption in the current spreading layer. Radiation emitted in the active layer of the semiconductor layer sequence, which radiation is firstly emitted in the direction of the current spreading layer and the carrier, is therefore absorbed in the current spreading layer to a lesser extent than in the case of a significantly thicker current spreading layer. The radiation emitted in the direction of the carrier is preferably reflected by a mirror layer arranged on the carrier in the direction toward a radiation exit side of the light-emitting diode chip.

The optical absorption in the current spreading layer is therefore advantageously also comparatively low since the one or the plurality of p-doped $Al_xGa_{1-x}As$ layers forming the current spreading layer have a proportion of aluminum x>0.5. On account of the comparatively large proportion of aluminum, the current spreading layer has a comparatively large electronic band gap which reduces the absorption of the radiation.

In one preferred configuration, the current spreading layer has a thickness of less than 300 nm. This further improves the stability of the layer with respect to oxidation and/or action of moisture and reduces the optical absorption.

It is particularly advantageous if, for the proportion of aluminum x in the current spreading layer $0.6 \le x \le 0.8$ holds true. In particular, low optical absorption in the current spreading layer can be obtained in this case.

The current spreading layer can be an individual layer composed of $Al_xGa_{1-x}As$ or a plurality of partial layers composed of $Al_xGa_{1-x}As$. For the case where the current spreading layer is composed of a plurality of partial layers, the advantageous configurations of the current spreading layer as described here and hereinafter apply to the totality of the partial layers. In particular, the thickness of a current spreading layer composed of a plurality of partial layers is overall less than 500 nm or particularly preferably even overall less than 300 nm.

The current spreading layer advantageously has a dopant concentration of more than $1 \times 10^{19}$ cm$^{-3}$. Particularly preferably, the dopant concentration in the current spreading layer is at least $5 \times 10^{19}$ cm$^{-3}$. A high electrical conductivity in the current spreading layer is advantageously obtained as a result of a high dopant concentration.

In one preferred configuration, the current spreading layer comprises C as dopant. It has advantageously been found that high dopant concentrations with good reproducibility can be obtained with C as dopant in AlGaAs layers.

In a further preferred configuration, the current spreading layer including its side flanks is provided with an encapsulation layer. The encapsulation layer can contain, in particular, silicon oxide, silicon nitride, a transparent conductive oxide such as, for example, zinc oxide or a metal. In order also to be able to provide the side flanks of the current spreading layer with an encapsulation layer, the current spreading layer can be structured, for example, before the encapsulation layer is applied. During the structuring, by way of example, edge regions of the current spreading layer can be removed, such that an encapsulation layer subsequently applied by means of a coating method also covers the side flanks of the current spreading layer. The encapsulation layer further reduces, in particular, the sensitivity of the current spreading layer toward environmental influences, in particular toward oxidation and/or the action of moisture. It is possible for the encapsulation layer to contain different materials in different partial regions. By way of example, the encapsulation layer can be formed from an electrically insulating material such as silicon oxide or silicon nitride, for example, in partial regions, while it is formed from an electrically conductive material such as zinc oxide, for example, or from a metal in other regions. In this case, the electrically conductive partial regions of the encapsulation layer, serve in particular, for impressing current into the current spreading layer.

In a further preferred configuration, the current spreading layer has oblique side flanks, which are inclined by an angle of between 20° and 70° inclusive with respect to the layer plane of the current spreading layer. The coupling-out of radiation from the optoelectronic component can be improved in this way. In particular, the oblique side flanks of the current spreading layer can function as microprisms by which radiation emitted in the active layer, said radiation being emitted in the direction of the carrier, is reflected toward the radiation exit side of the light-emitting diode chip. It is possible for the oblique side flanks to extend right into the phosphide compound semiconductor layer sequence, such that one or a plurality of layers of the semiconductor layer sequence also have oblique side flanks.

In a further advantageous configuration, at least one trench is formed in the current spreading layer. The at least one trench is preferably filled with silicon nitride, silicon oxide, zinc oxide or a metal. In the region of the trench of the current spreading layer, the filling material directly adjoins the p-type semiconductor region. Through the trench it is possible to define, in a targeted manner, a current path through the semiconductor layer sequence. It is advantageously also possible for the at least one trench to extend right into the p-type phosphide compound semiconductor region.

In a further advantageous configuration, at least one layer composed of $In_xGa_yAl_{1-x-y}As$ where $0 \le x \le 1$, $0 \le y \le 1$ and $x+y \le 1$ adjoins the current spreading layer, and has a smaller band gap and a lower dopant concentration than the current spreading layer. At the interface between the current spreading layer and the layer having the smaller band gap and lower dopant concentration, in this case a bending of the band edges of the conduction band and of the valence band respectively occurs, which leads to the formation of a two-dimensional hole gas having a high conductivity. In this way, regions having high charge carrier concentration and charge carrier mobility can be produced in a targeted manner.

It is possible for the at least one AlGaAs layer in the current spreading layer to contain a small proportion of one or a plurality of further elements. The proportion of the one or of the plurality of further elements in the current spreading layer is less than 10% in this case. The one or the plurality of further elements can be dopants, or small amounts of a further material of the third or fifth main group of the periodic system.

BRIEF DESCRIPTION OF THE DRAWINGS

The invention is explained in greater detail below on the basis of exemplary embodiments in connection with FIGS. 1 to 5.

Identical or identically acting elements are provided with the same reference signs in the figures. The sizes of the individual elements and the size relationships of the elements among one anther should not be regarded as true to scale.

DETAILED DESCRIPTION OF ILLUSTRATIVE EMBODIMENTS

Figure 1:
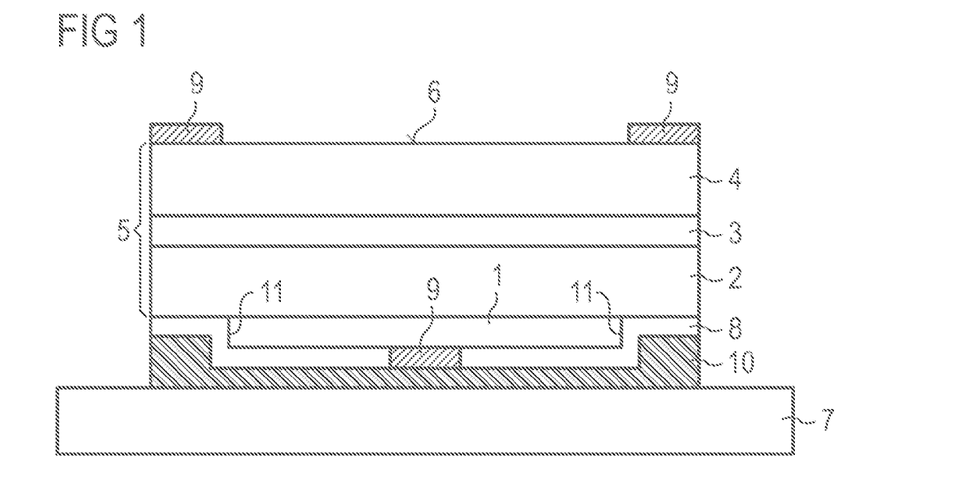
FIG. 1 shows a schematic illustration of a cross section through a light-emitting diode chip in accordance with a first exemplary embodiment.

The thin-film light-emitting diode chip illustrated in FIG. 1 contains a semiconductor layer sequence 5 comprising a p-type semiconductor region 2 and an n-type semiconductor region 4. An active layer 3 is arranged between the p-type semiconductor region 2 and the n-type semiconductor region 4. The active layer 3 preferably has a single or multiple quantum well structure.

The semiconductor layer sequence 5 is based on a phosphide compound semiconductor, that is to say that the semiconductor layers contained in the semiconductor layer sequence 5 comprise, in particular, $In_xGa_yAl_{1-x-y}P$ where $0 \leq x \leq 1$, $0 \leq y \leq 1$ and $x+y \leq 1$. In particular, the p-type semiconductor region 2, the active layer 3 and the n-type semiconductor region are formed from phosphide compound semiconductor materials.

The light-emitting diode chip is a so-called thin-film LED, wherein a growth substrate used for the growth of the semiconductor layer sequence 5 has been detached from the semiconductor layer sequence 5. In particular, the growth substrate can be detached from the n-type semiconductor region 4, which now has the radiation exit area 6 of the light-emitting diode chip. At a side opposite the original growth substrate and the radiation exit area 6, the light-emitting diode chip is connected to a carrier 7, which preferably comprises silicon, germanium or molybdenum. In the case of the thin-film light-emitting diode chip, therefore the n-type semiconductor region 4 faces the radiation exit area 6 and the p-type semiconductor region 2 faces the carrier 7.

A current spreading layer 1 is arranged between the carrier 7 and the p-type phosphide compound semiconductor region 2. The current spreading layer 1 is a p-doped $Al_xGa_{1-x}As$ layer where $0.5 < x \leq 1$, which has a thickness of less than 500 nm.

Preferably, the thickness of the current spreading layer 1 is even only less than 300 nm. For the proportion of aluminum x in the current spreading layer 1, $0.6 \leq x \leq 0.8$ preferably holds true.

The current spreading layer 1 adjoins an electrical contact 9 at least in partial regions at a side facing the carrier 7. At least one further electrical contact 9 of the light-emitting diode chip is arranged, for example, on the radiation exit side 6 of the light-emitting diode chip, said radiation exit side being opposite the carrier. The current spreading layer 1 preferably has a dopant concentration of more than $1 \times 10^{19}$ $cm^{-3}$ and particularly preferably of more than $5 \times 10^{19}$ $cm^{-3}$. A high transverse conductivity of the current spreading layer 1 is obtained in this way, such that a current flows through the semiconductor layer sequence 5 comparatively homogeneously even when the rear-side contact 9 is applied, for example, only to a small central region of the current spreading layer 1.

On account of its small thickness of less than 500 nm or preferably of less than 300 nm and on account of the high aluminum content of more than 0.5, the current spreading layer 1 has advantageously low optical absorption. Furthermore, it has been found that such a thin current spreading layer 1 is less sensitive to oxidation or the action of moisture than comparatively thick conventional current spreading layers that typically have a thickness of 1 um or more. Despite the small thickness, good current spreading is obtained with the current spreading layer 1, wherein it is advantageous if the current spreading layer 1 has a dopant concentration of at least $1 \times 10^{19}$ $cm^{-3}$ and particularly preferably of at least $5 \times 10^{19}$ $cm^{-3}$.

It is furthermore advantageous that the current spreading layer 1 adjoining the p-type semiconductor region 2 is arranged between the carrier 7 and the p-type semiconductor region 2 since with this arrangement it is better protected against external influences such as oxidation or moisture than if it adjoined the ambient medium at the surface of the light-emitting diode chip.

It is possible for the current spreading layer 1 to be composed of a plurality of partial layers (not illustrated) made of $Al_xGa_{1-x}As$ where in each case $0.5 < x \leq 1$, wherein the partial layers can differ from one another for example in terms of their dopant concentration and/or in terms of their aluminum content. In this case, in the context of this application, the totality of the partial layers is regarded as the current spreading layer 1, such that, in particular, the total thickness of all the partial layers is less than 500 nm and preferably less than 300 nm. It is also conceivable for the current spreading layer 1 or the partial layers of the current spreading layer to have small amounts of additional materials, the proportion of which, however, overall is less than 10%.

In order to protect the current spreading layer 1 even better against external influences, said current spreading layer preferably including its side flanks 11 is provided with an encapsulation layer 8. The encapsulation layer 8 can comprise, in particular, a transparent dielectric material such as, for example, silicon nitride or silicon oxide. Alternatively, however, it is also possible for the encapsulation layer 8 to comprise a transparent conductive oxide such as, for example, zinc oxide or a metal. Particularly in the case of an encapsulation layer 8 composed of a dielectric material, the electrical contact 9 for the current spreading layer 1 can be arranged in a cutout of the encapsulation layer 8.

A layer sequence 10 composed of a metal or a metal alloy is arranged between the encapsulation layer 8, the electrical contact layer 9 and the carrier 7. The metallic layers 10 can contain, for example, a mirror layer for reflecting the radiation emitted from the active layer 3 in the direction of the carrier 7. Furthermore, the metallic layers 10 can also comprise a solder layer for connecting the light-emitting diode chip to the carrier 7.

Figure 2:
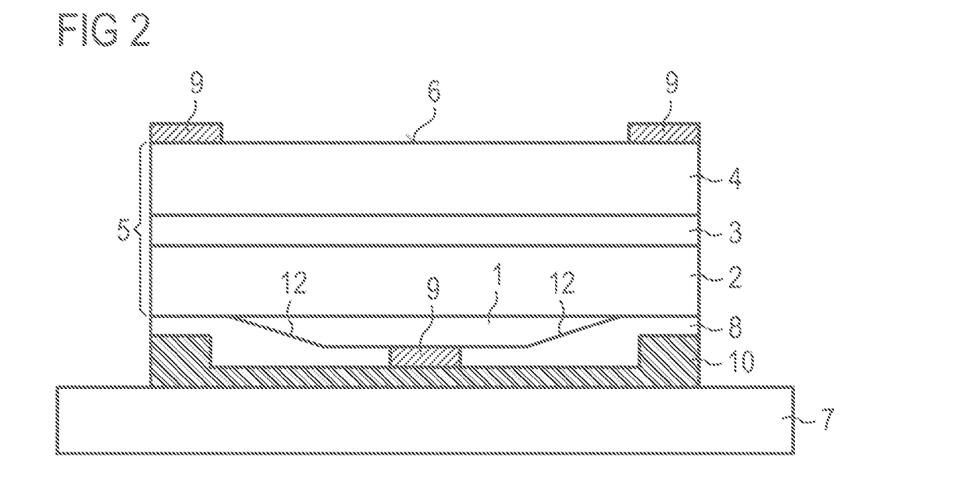
FIG. 2 shows a schematic illustration of a cross section through a light-emitting diode chip in accordance with a second exemplary embodiment.

The exemplary embodiment of a light-emitting diode chip as illustrated in FIG. 2 differs from the exemplary embodiment in FIG. 1 in that the current spreading layer 1 has oblique side flanks 12. The oblique side flanks 12 preferably form an angle of between 20° and 70° inclusive with the layer plane of the current spreading layer 1. It has been found that the coupling-out of radiation from the light-emitting diode chip can be improved by means of the oblique side flanks 12 of the current spreading layer 1. On account of the difference in refractive index between the current spreading layer 1 and the encapsulation layer 8, the oblique side flanks 12 act as reflectors that can reflect radiation in the direction toward the radiation exit area 6. In particular, it is possible for the opposite oblique side flanks 12 of the current spreading layer 1 to form a microprism. It is also possible for the oblique side flanks 12 to extend right into the semiconductor layer sequence 5 (not illustrated).

With regard to the further advantageous configurations, the exemplary embodiment illustrated in FIG. 2 corresponds to the first exemplary embodiment.

Figure 3:
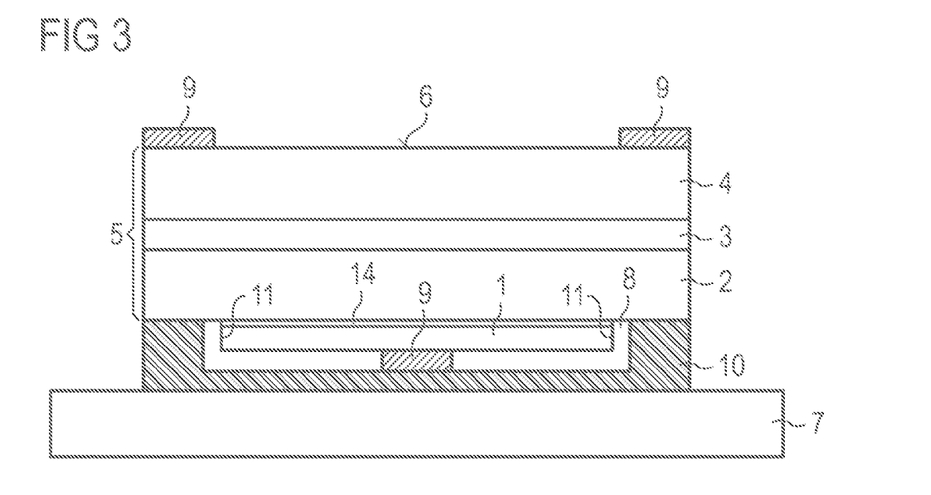
FIG. 3 shows a schematic illustration of a cross section through a light-emitting diode chip in accordance with a third exemplary embodiment.

The exemplary embodiment of a light-emitting diode chip as illustrated in FIG. 3 differs from the exemplary embodiment illustrated in FIG. 1 in that the metallic layer sequence 10 in the region of the side flanks of the light-emitting diode chip reaches as far as the p-type semiconductor region 2. Consequently, the current spreading layer 1 including its side flanks 11 is enclosed by the encapsulation layer 8, and the encapsulation layer 8 is enclosed by the metallic layer sequence 10. Particularly good resistance of the current spreading layer 1 to oxidation or the action of moisture is obtained in this way.

The exemplary embodiment illustrated in FIG. 3 furthermore differs from the exemplary embodiment illustrated in FIG. 1 in that an $In_xGa_yAl_{1-x-y}As$ layer 14 where $0 \leq x \leq 1$, $0 \leq y \leq 1$ and $x+y \leq 1$ adjoins the current spreading layer 1, and has a lower dopant concentration and a smaller band gap than the current spreading layer 1. The layer 14 is preferably arranged between the current spreading layer 1 and the p-type semiconductor region 2. At the interface with the more highly doped current spreading layer 1 the layer 14 forms a potential well in which free charge carriers in the form of holes accumulate. The holes form a so-called two-dimensional hole gas in the layer 14. In this way, a particularly high transverse conductivity is obtained in the layer 14.

Figure 4:
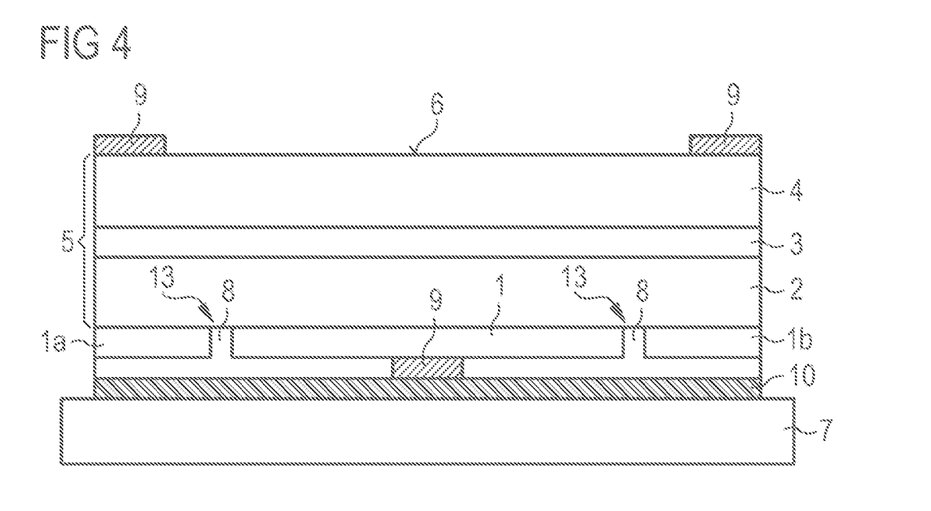
FIG. 4 shows a schematic illustration of a cross section through a light-emitting diode chip in accordance with a fourth exemplary embodiment.

In the case of the exemplary embodiment of a light-emitting diode chip as illustrated in FIG. 4, two trenches 13 are formed in the current spreading layer 1, into which the encapsulation layer 8 projects. That region of the current spreading layer 1 which is arranged between the trenches 13 is electrically connected by means of the electrical contact 9 and the metallic layer sequence 10. By contrast, the edge regions 1a, 1b of the current spreading layer 1 are not electrically connected. Generation of radiation in the regions of the semiconductor chip which are arranged below the contacts 9 arranged in the edge regions on the radiation exit area of the light-emitting diode chip is reduced in this way.

Figure 5:
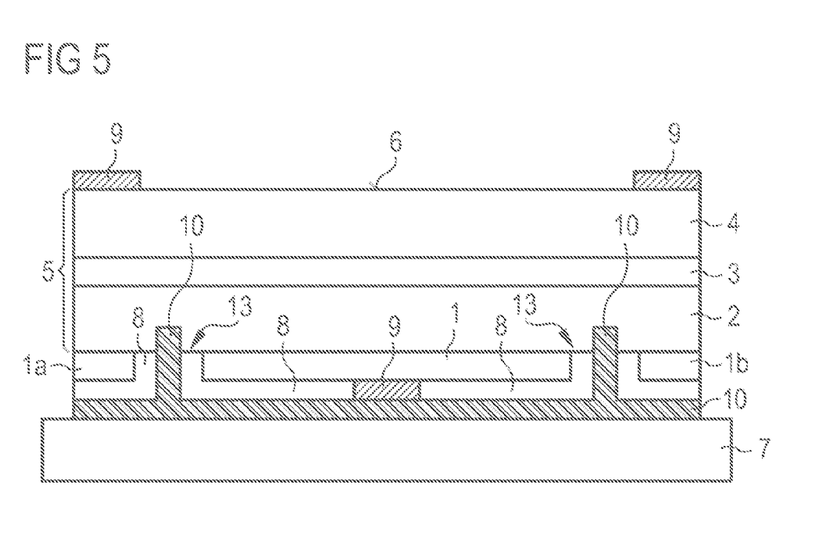
FIG. 5 shows a schematic illustration of a cross section through a light-emitting diode chip in accordance with a fifth exemplary embodiment.

FIG. 5 illustrates a further exemplary embodiment of a light-emitting diode chip wherein two trenches 13 are formed in the current spreading layer 1. In the trenches, the metallic layer sequence 10 extends right into the p-type semiconductor region 2. The metallic layer sequence 10 is insulated from the current spreading layer 1 outside the region of the contact 9 by the encapsulation layer 8.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

What is claimed is:

1. A light-emitting diode chip comprising a semiconductor layer sequence comprising a phosphide compound semiconductor material, wherein the semiconductor layer sequence comprises:
    a p-type semiconductor region, wherein the p-type semiconductor region faces a carrier of the light-emitting diode chip,
    an n-type semiconductor region, wherein the n-type semiconductor region faces a radiation exit area of the light-emitting diode chip,
    an active layer arranged between the p-type semiconductor region and the n-type semiconductor region, said active layer being embodied as one of a p-n junction, a double heterostructure, a multiple heterostructure, a single quantum well structure and a multiple quantum well structure and thus configured to emit electromagnetic radiation,
    a current spreading layer having a thickness of less than 500 nm arranged between the carrier and the p-type semiconductor region, wherein the current spreading layer comprises one or a plurality of p-doped $Al_xGa_{1-x}As$ layers, and wherein two trenches are formed in the current spreading layer in such a way that edge regions of the current spreading layer outside the trenches are not directly electrically connected to a region of the current spreading layer arranged between the trenches, and wherein the edge regions of the current spreading layer are not directly connected to an electrical contact that is arranged on a region of the current spreading layer within the trenches.

2. The light-emitting diode chip according to claim 1, wherein the current spreading layer has a thickness of less than 300 nm.

3. The light-emitting diode chip according to claim 1, wherein $0.6 \leq x \leq 0.8$.

4. The light-emitting diode chip according to claim 1, wherein the current spreading layer has a dopant concentration of more than $1*10^{19}$ cm$^{-3}$, and wherein another electrical contact is arranged on a side of the n-type semiconductor region remote from the carrier on the radiation exit area.

5. The light-emitting diode chip according to claim 1, wherein the current spreading layer has a dopant concentration of at least $5*10^{19}$ cm$^{-3}$.

6. The light-emitting diode chip according to claim 1, wherein the current spreading layer is doped with carbon.

7. The light-emitting diode chip according to claim 1, wherein the trenches are filled with silicon nitride, silicon oxide, zinc oxide or a metal.

8. The light-emitting diode chip according to claim 1, wherein the trenches extend into the p-type semiconductor region.

9. The light-emitting diode chip according to claim 1, wherein a metallic layer sequence is arranged on the carrier and the metallic layer sequence extends through the trenches into the p-type semiconductor region, and wherein electrical contacts are arranged between the metallic layer and the current spreading layer.

10. The light-emitting diode chip according to claim 1, further comprising a further layer composed of $In_xGa_yAl_{1-x-y}As$, where $0 \leq x \leq 1$, $0 \leq y \leq 1$ and $x+y \leq 1$, adjoining the current spreading layer, the further layer having a smaller band gap and a lower dopant concentration than the current spreading layer.

11. A light-emitting diode chip comprising:
    a semiconductor layer sequence comprising a phosphide compound semiconductor material;
    a carrier on which the semiconductor layer sequence is arranged;
    a mirror layer arranged on the carrier for reflecting electromagnetic radiation, generated by the light-emitting diode chip during operation, away from the carrier towards a radiation exit area being opposite the carrier;
    a current spreading layer disposed over the mirror layer and between the semiconductor layer sequence and the mirror layer, the current spreading layer having one or a plurality of p-doped $Al_xGa_{1-x}As$ layers with $0.5 < x \leq 1$, so that the current spreading layer spreads the flow of current during the operation of the light-emitting diode chip;

the semiconductor layer sequence comprises:
- a p-type semiconductor region disposed over the carrier and contacting the current spreading layer,
- an active layer disposed over and contacting the p-type semiconductor region, the active layer being embodied as one of a p-n junction, a double heterostructure, a multiple heterostructure, a single quantum well structure and a multiple quantum well structure and thus configured to emit electromagnetic radiation, and
- an n-type semiconductor region disposed over the p-type semiconductor region and the active layer and contacting the active layer, wherein the n-type semiconductor region faces the radiation exit area of the light-emitting diode chip; and
- two isolation trenches disposed in the current spreading layer, wherein the trenches separate the current spreading layer into a central region and edge regions isolated from the central region, and wherein the central region of the current spreading layer is electrically connected to the mirror layer, and wherein the edge regions of the current spreading layer are not directly connected to an electrical contact that is arranged on the central region.

12. The light-emitting diode chip according to claim 11, wherein the current spreading layer has a thickness of less than 300 nm.

13. The light-emitting diode chip according to claim 11, wherein $0.6 \leq x \leq 0.8$.

14. The light-emitting diode chip according to claim 11, wherein the current spreading layer has a dopant concentration of more than $1*10^{19}$ cm$^{-3}$.

15. The light-emitting diode chip according to claim 11, wherein the current spreading layer as a dopant concentration of at least $5*10^{19}$ cm$^{-3}$.

16. The light-emitting diode chip according to claim 11, wherein the current spreading layer is doped with carbon.

17. The light-emitting diode chip according to claim 11, wherein the trenches are filled with silicon nitride, silicon oxide, and wherein another electrical contact is arranged on a side of the n-type semiconductor region remote from the carrier on the radiation exit area.

18. The light-emitting diode chip according to claim 11, wherein the trenches extend into the p-type semiconductor region.

19. The light-emitting diode chip according to claim 11, further comprising a further layer composed of In$_x$Ga$_y$Al1-x-yAs, where $0 \leq x \leq 1$, $0 \leq y \leq 1$ and $x+y \leq 1$, adjoining the current spreading layer, the further layer having a smaller band gap and a lower dopant concentration than the current spreading layer.

20. A light-emitting diode chip comprising:
- a semiconductor layer sequence comprising a phosphide compound semiconductor material;
- a carrier on which the semiconductor layer sequence is arranged;
- a mirror layer arranged on the carrier for reflecting electromagnetic radiation, generated by the light-emitting diode chip during operation, away from the carrier towards a radiation exit area being opposite the carrier;
- a current spreading layer disposed over the mirror layer and between the semiconductor layer sequence and the mirror layer, the current spreading layer having one or a plurality of p-doped Al$_x$Ga$_{1-x}$As layers with $0.5 < x \leq 1$, so that the current spreading layer spreads the flow of current during the operation of the light-emitting diode chip;

wherein the semiconductor layer sequence comprises:
- a p-type semiconductor region disposed over the carrier and contacting the current spreading layer,
- an active layer disposed over and contacting the p-type semiconductor region, the active layer being embodied as one of a p-n junction, a double heterostructure, a multiple heterostructure, a single quantum well structure and a multiple quantum well structure and thus configured to emit electromagnetic radiation, and
- an n-type semiconductor region disposed over the p-type semiconductor region and the active layer and contacting the active layer, wherein the n-type semiconductor region faces the radiation exit area of the light-emitting diode chip; and
- a trench disposed in the current spreading layer, wherein the mirror layer extends through the trench into the p-type semiconductor region, wherein the trench separates the current spreading layer into a peripheral region and a central region that is isolated from the peripheral region, and wherein the peripheral region is not directly connected to an electrical contact that is arranged on the central region.

* * * * *

UNITED STATES PATENT AND TRADEMARK OFFICE
CERTIFICATE OF CORRECTION

PATENT NO. : 9,853,188 B2
APPLICATION NO. : 14/830616
DATED : December 26, 2017
INVENTOR(S) : Sundgren et al.

It is certified that error appears in the above-identified patent and that said Letters Patent is hereby corrected as shown below:

In the Claims

In Column 8, Lines 9-10, Claim 1, delete "$Al_xGa_{1-x}As$ layers," and insert --$Al_xGa_{1-x}As$ layers,--.

In Column 8, Lines 50-51, Claim 10, delete "InxGayAl1-x-yAs," and insert --$In_xGa_yAl_{1-x-y}As$,--.

In Column 10, Lines 2-3, Claim 19, delete "InxGayAl1-x-yAs," and insert --$In_xGa_yAl_{1-x-y}As$,--.

Signed and Sealed this
First Day of May, 2018

Andrei Iancu
*Director of the United States Patent and Trademark Office*